United States Patent [19]

Dollard

[11] Patent Number: 4,476,458

[45] Date of Patent: Oct. 9, 1984

[54] DUAL THRESHOLD DECODER FOR CONVOLUTIONAL SELF-ORTHOGONAL CODES

[75] Inventor: Peter M. Dollard, Highlands, N.J.

[73] Assignee: AT&T Bell Laboratories, Murray Hill, N.J.

[21] Appl. No.: 387,954

[22] Filed: Jun. 14, 1982

[51] Int. Cl.³ .............................................. H03K 13/02
[52] U.S. Cl. ................................. 340/347 DD; 371/36; 371/43
[58] Field of Search ..................... 371/36, 37, 43–46; 340/347 DD

[56] References Cited

U.S. PATENT DOCUMENTS

| | | | |
|---|---|---|---|
| 3,227,999 | 1/1966 | Hagelbarger | 371/37 |
| 3,439,334 | 4/1969 | Massey | 371/43 |
| 3,508,197 | 4/1970 | Tong | 371/45 |
| 3,568,148 | 3/1971 | Clark | 371/37 |
| 3,605,090 | 9/1971 | Burton | 371/43 |
| 4,119,945 | 10/1978 | Lewis | 371/43 |

OTHER PUBLICATIONS

Wu "IEEE Transactions on Communications", vol. COM-23, No. 9, Sep. 1975, pp. 942–955.
Wu "IEEE Transactions on Communications", vol. COM-24, No. 1, Jan. 1976, pp. 19–33.
Wu "IEEE Transactions on Communications", vol. COM-24, No. 9, Sep. 1976, pp. 946–955.

*Primary Examiner*—C. D. Miller
*Attorney, Agent, or Firm*—Erwin W. Pfeifle; Wendy W. Koba

[57] ABSTRACT

The present invention relates to a decoder (10) for convolutional self-orthogonal codes which includes a multistage syndrome register (16) and is responsive to two separate threshold levels. The first threshold level, as in prior art arrangements, includes a first majority logic circuit (24) connected to selected stages of the syndrome register and functions to correct the information bits ($X_1$–$X_7$) currently being processed. Instead of also using this majority logic circuit to correct the syndrome register, as in the prior art, the present invention includes a second majority logic circuit (28), which operates at a different threshold level than the first and functions to correct the selected stages of the multistage syndrome register.

5 Claims, 2 Drawing Figures

DUAL THRESHOLD DECODER FOR CONVOLUTIONAL SELF-ORTHOGONAL CODES

BACKGROUND OF THE INVENTION

1. Field of the Invention

The present invention relates to a decoder for convolutional self-orthogonal codes (CSOC's), and more particularly, to a dual threshold decoder wherein a first threshold logic circuit is employed to correct the information bit currently being processed and a second threshold logic circuit is employed in a feedback arrangement to correct selected bits contained in a syndrome register storing a plurality of syndrome bits used to correct the received convolutional self-orthogonal code.

2. Description of the Prior Art

Two systematic procedures are known for threshold decoding of a redundant sequence which includes information signals encoded in accordance with a convolutional, self-orthogonal code. One of these procedures, defined as direct decoding, is embodied in the error-correcting system disclosed in U.S. Pat. No. 3,227,999 issued to D. W. Hagelbarger on Jan. 4, 1966. There, each decoding correction made with respect to an information signal is not fed back to change the nature of a stored syndrome or error pattern representation. If such a change were made, the decoding of subsequently processed information signals would be directly influenced. In other words, in direct decoding there is no feedback connection in the decoding circuitry. Hence, an erroneous decision by the decoder cannot lead to other faulty decisions in subsequent processing. In effect, a positive immunity against error propagation in the decoding process is thereby achieved (but at the expense of reduced error-correcting capabilities).

The other available procedure for processing convolutional self-orthogonal codes is known as feedback decoding. As disclosed in U.S. Pat. No. 3,439,334 issued to J. L. Massey on Apr. 15, 1969, each decoding correction made not only corrects the information bit, but is also fed back to the syndrome register to correct (rightly or wrongly) the affected bits of the syndrome register. It is apparent that in a feedback decoder a bad decoding decision can introduce additional errors in the decoding process.

The problem remaining in the prior art, therefore, is to provide a decoder for convolutional self-orthogonal codes which has greater error-correcting capabilities than a direct decoder but which exhibits considerably less of an error propagation problem than a conventional feedback decoder.

SUMMARY OF THE INVENTION

The problem remaining in the prior art has been solved in accordance with the present invention, which relates to a decoder for convolutional self-orthogonal codes (CSOC's), and more particularly, to a dual threshold decoder wherein a first threshold logic circuit is employed to correct the information bit currently being processed and a second threshold logic circuit is employed in a feedback arrangement to correct selected bits contained in syndrome register storing a plurality of syndrome bits used to correct the received convolutional self-orthogonal code.

DETAILED DESCRIPTION

In convolutional coding schemes, groups of a m code bits are transmitted during a given time interval, where a given group of m code bits include k data bits and (m-k), or p, parity bits. In contrast with block codes which generate m code bits in a particular time span based only upon the k data bits from the corresponding time interval, convolutional codes generate m code bits based upon both the k data bits from the corresponding time interval and a subset of the (N−1)·k data bits from the (N−1) previous time intervals. The parameter N, multiplied by m, gives the constraint length of the code, that is, K=Nm. A code rate, r, is defined as the ratio of data bits to total bits transmitted per group, or r=k/m. Upon reception, the parity bits are separated from the information bits and the parity bits are incorporated into a set of equations called the syndrome equations. The solution to these syndrome equations are then used by the decoder to check the accuracy of the received information bits. Several techniques exist in the art for generating these syndrome equations and are discussed in the book "Threshold Decoding" by J. L. Massey (M.I.T. Press, Cambridge, Mass., 1963).

For illustrative purposes, the remaining discussion of the present invention will utilize a code rate $\frac{7}{8}$, constraint length 384 convolutional self-orthogonal code. The syndrome equations for this code, wich may be employed in a T1 data rate digital FDMA satellite system, are included in Table I.

$$g_1(D) = D^0 + D^3 + D^{19} + D^{42}$$
$$g_2(D) = D^0 + D^{21} + D^{34} + D^{43}$$
$$g_3(D) = D^0 + D^{29} + D^{33} + D^{47}$$
$$g_4(D) = D^0 + D^{25} + D^{36} + D^{37}$$
$$g_5(D) = D^0 + D^{15} + D^{20} + D^{46}$$
$$g_6(D) = D^0 + D^2 + D^8 + D^{32}$$
$$g_7(D) = D^0 + D^7 + D^{17} + D^{45}$$

In encoding this $\frac{7}{8}$ code rate CSOC, a single parity bit is appended to each group of seven unaltered data bits, and the eight-channel-bit code groups are then transmitted in sequence. Each parity bit is a parity check on 28 data bits, which include the seven data bits from the current group plus one data bit from each of 21 earlier groups. Each data bit contributes to the parity bit of its own group, and is retained in memory to contribute to the parity bit in each of three future groups, thus each data bit affects the value of four parity bits. However, no two data bits, whether different bits in the same group, corresponding bits in different groups, or different bits from different groups, affect more than a single common parity bit. This is known as the "self-orthogonal" property.

Figure 1:
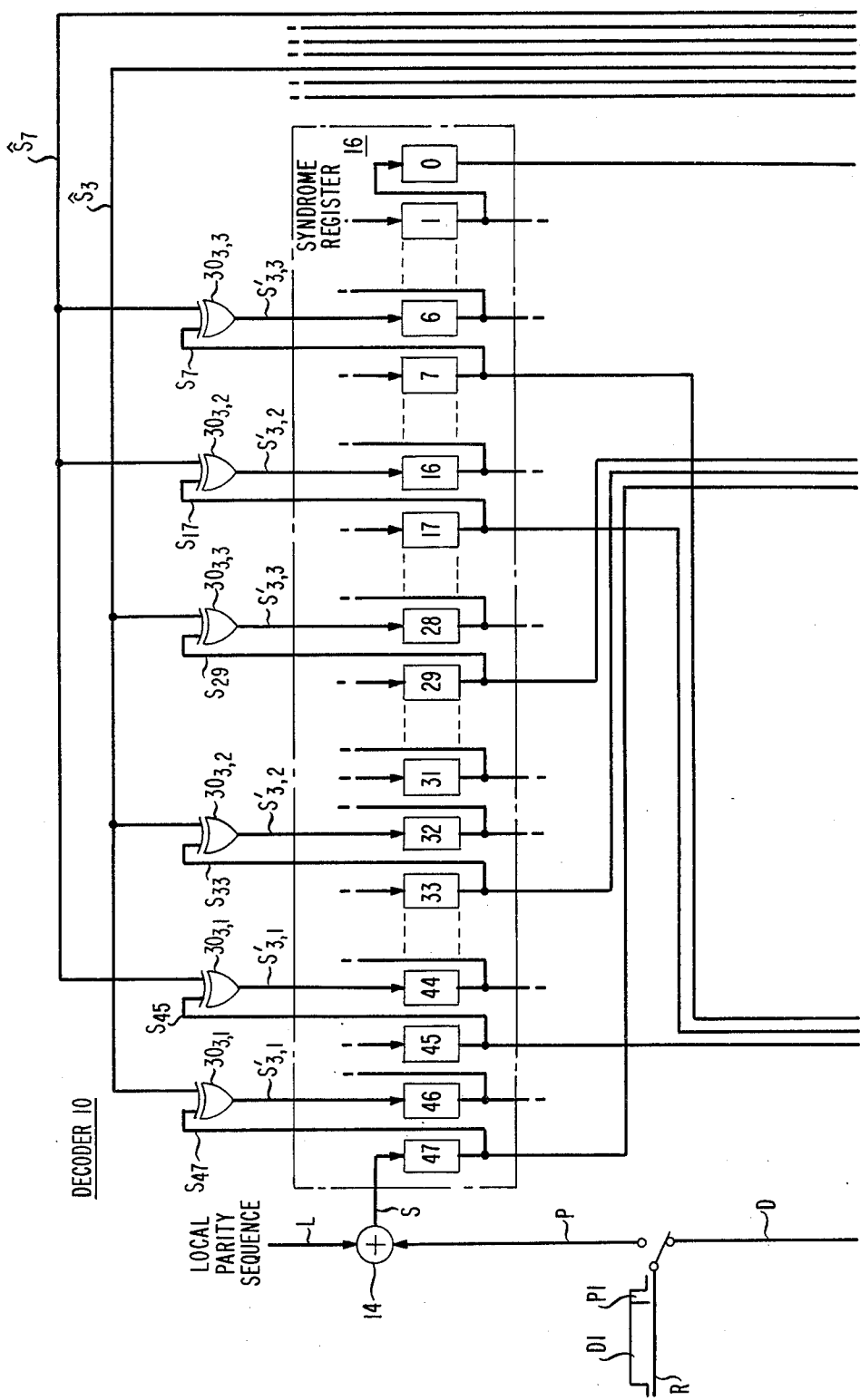
FIGS. 1 and 2 illustrates an exemplary decoder for convolutional self-orthogonal codes formed in accordance with the present invention including a code rate $= \frac{7}{8}$ and a constraint length K=384.
Figure 2:
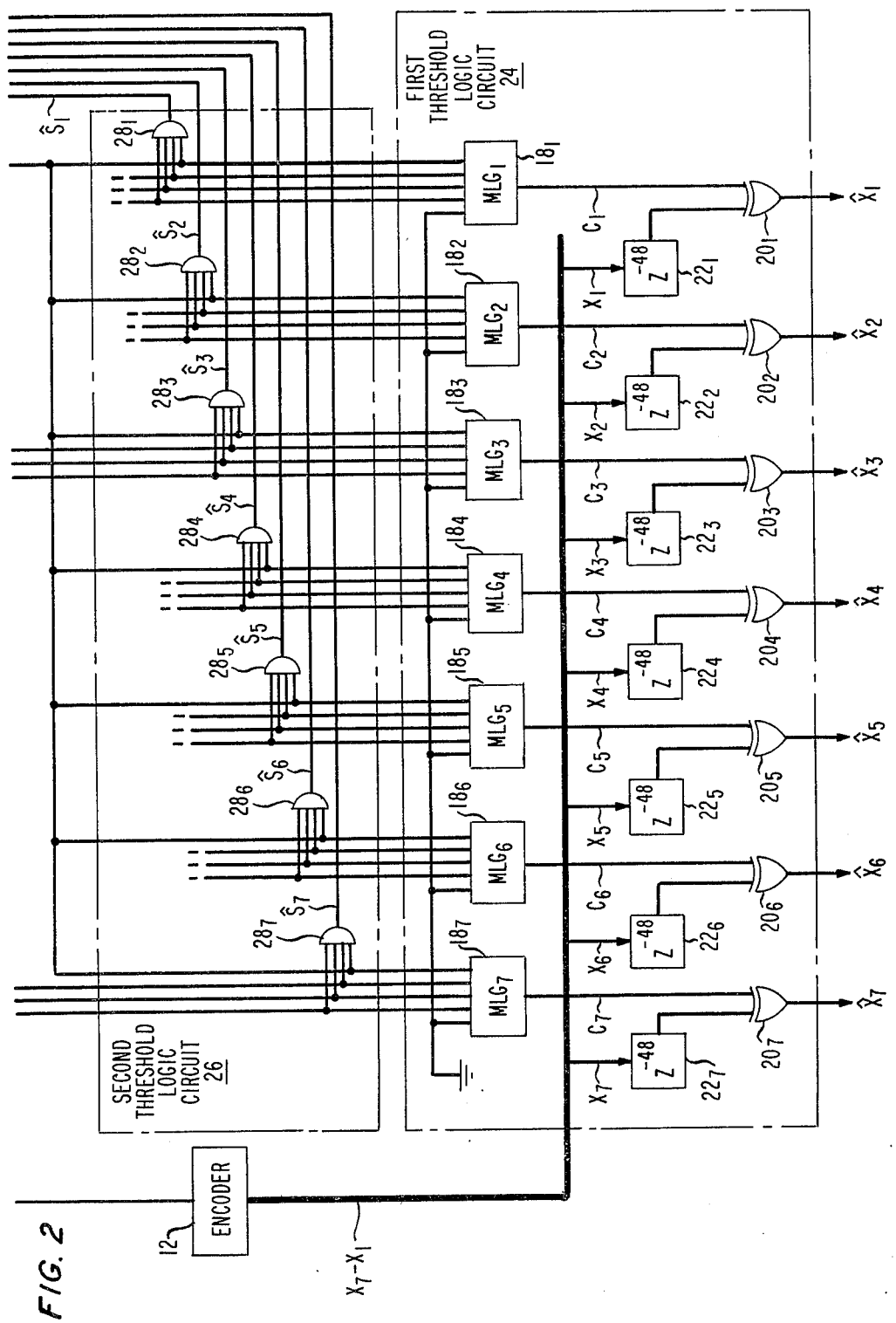

An exemplary decoder 10 capable of receiving and decoding a transmitted $\frac{7}{8}$ code rate CSOC is illustrated in FIGS. 1 and 2. As shown, a received sequence R comprises a databit sequence D and a parity-bit sequence P. Upon arrival, received sequence R is divided into its separate data and parity sequences. Data-bit sequence D is applied as an input to a local encoder 12, where local encoder 12 is a replica of the encoder used to generate the transmitted sequence denoted $X_1$-$X_7$. Parity-bit sequence P is applied as a first input to a modulo-2 adder 14, where the second input to modulo-2 adder 14 is a locally generated parity-bit sequence L. The output of modulo-2 adder 14 is a syndrome sequence S which is subsequently applied as an input to a syndrome register 16. In this example, syndrome register 16 is a 48-bit shift register and syndrome sequence S is clocked and stored in syndrome register 16 at the group rate. As described in greater detail hereinafter, data-bit sequence X will also be stored through 48 clock cycles to ensure that all four syndrome bits affected by any one data bit have been accumulated in syndrome register 16 at the time that the decision on that particular data bit is to be rendered.

Included in a first threshold logic circuit 24 of decoder 10 is a plurality of seven majority logic gates (MLG) $18_1$-$18_7$, each with five inputs. The five inputs to an exemplary MLG $18_i$ comprise the oldest bit in syndrome register 16, $S_O$, the three remaining (later) syndrome bits affected by a data bit $X_i$ of the current data-bit sequence X (as determined by the related syndrome sequence $g_i$ (D) of Table I), and a fifth input which is permanent ground (i.e., always equal to zero). For example, referring to Table I, the syndrome bit applied as inputs to MLG $18_3$ will be bits $S_O$, $S_{29}$, $S_{33}$ and $S_{47}$ from syndrome register 16, that is, those syndrome bits related to data bit $X_3$. The inputs for the remaining majority logic gates are determined in the same fashion. In accordance with the present invention, each MLG $18_1$-$18_7$ includes a threshold value of 3, that is, the output from an exemplary MLG $18_i$ will be equal to the value 1 if and only if at least three out of the five inputs applied thereto are equal to the value 1.

The outputs from MLG $18_1$-$18_7$, denoted data correction outputs $C_1$-$C_7$, are subsequently applid as separate inputs to a plurality of seven exclusive OR (EOR) gates $20_1$-$20_7$. In particular, data correction output $C_1$ from MLG $18_1$ is applied as an input to EOR gate $20_1$, data correction output $C_2$ to EOR gate $20_2$, and so on, with data correction output $C_7$ from MLG $18_7$ applied as an input to EOR gate $20_7$. Each EOR gate $20_1$-$20_7$ is also responsive to a separate one of the plurality of data bits $X_1$-$X_7$ forming data sequence X. Since the decoding process must wait until the syndrome sequence S associated with the current data sequence X propagates through the 48 bits forming syndrome register 16 and occupies bit $S_O$ of syndrome register 16, data sequence X must be subjected to a 48-bit delay prior to being applied as separate inputs to the plurality of EOR $20_1$-$20_7$. Therefore, as shown in FIG. 2, each data bit $X_1$-$X_7$ is applied as an input to a separate one of a plurality of seven delay elements $22_1$-$22_7$, where each delay element functions to hold the associated data bit and suspend processing thereon until the associated parity bit P reaches the last bit, $S_O$, of syndrome register 16. Hence, an exemplary EOR gate $20_i$ receives as simultaneous inputs both data correction bit $C_i$ from MLG $18_i$ and received data bit $X_i$ from delay element $22_i$.

In accordance with the exclusive OR function, the output of EOR gate $20_i$ will be equal to the value 1 if and only if either data bit $X_i$ is equal to 1 or data correction bit $C_i$ is equal to 1, but not both are equal to 1, and is defined as a corrected data bit $\hat{X}$. Table II below shows the relation between $C_i$, $X_i$ and $\hat{X}_i$.

| $C_i$ | $X_i$ | $\hat{X}_i$ | Explanation |
|---|---|---|---|
| 0 | 0 | 0 | uncorrected data bit |
| 0 | 1 | 1 | uncorrected data bit |
| 1 | 0 | 1 | corrected data bit |
| 1 | 1 | 0 | corrected data bit |

As seen by reference to Table II, a data bit $X_i$ is corrected only when date correction bit $C_i$ is equal to the value 1, that is, when at least three elements of the associated syndrome equation $g_i$ (D) are equal to 1.

The set of majority logic gates $18_1$-$18_7$, EOR gates $20_1$-$20_7$, and delay elements $22_1$-$22_7$, therefore, form a first threshold logic circuit 24 of decoder 10, where as mentioned hereinbefore, the threshold level is set at 3-out-of-5. Thus, first threshold logic circuit 24 functions to correct data bits $X_1$-$X_7$ of data-bit sequence D, but does not interfere at all with the syndrome bit values $S_{47}$-$S_0$ contained in syndrome register 16. In accordance with the present invention, a second threshold logic circuit 26 functions to correct the separate bits $S_{47}$-$S_0$ of syndrome register 16, where second threshold logic circuit 26 comprises a higher threshold level than that associated with first threshold logic circuit 24. For the exemplary decoder 10 illustrated in FIG. 1, therefore, where first threshold logic circuit 24 comprises a threshold level of 3, second threshold logic circuit 26 will comprise a threshold level of four.

As shown in FIG. 2, second threshold logic circuit 26 comprises a plurality of seven AND gates $28_1$-$28_7$, where each AND gate $28_1$-$28_7$ is added in parallel with its associated MLG $18_1$-$18_7$. It is to be understood that instead of AND gates $28_1$-$28_7$, second threshold logic circuit 26 could comprise a second plurality of majority logic gates which are arranged to include a threshold level of four. Referring back to FIG. 2, each AND gate $28_1$-$28_7$ is coupled to receive as separate inputs the four syndrome bits which are applied as inputs to its associated MLG $18_1$-$18_7$. For example, as shown in FIGS. 1 and 2 syndrome bits $S_0$, $S_{29}$, $S_{33}$ and $S_{47}$ are applied as separate inputs to AND gate $28_3$. Therefore, in order for the output syndrome correction bit $\hat{S}_i$ of AND gate $28_i$ to be equal to the value 1, all four syndrome bits applied as inputs thereto must also equal 1. Thus, in association with the dualthreshold aspect of the present invention, for the same current data bit $X_i$, data correction bit $C_i$ could be equal to 1 and syndrome correction bit $\hat{S}_i$ could be equal to 0, where this situation will occur when three out of four syndrome bits related to data bit $X_i$ are equal to one.

Each syndrome correction bit $\hat{S}_1$-$\hat{S}_7$ is subsequently fed back and applied as an input to a separate one of a plurality of seven sets of EOR gates $30_1$-$30_7$, where each set includes three separate EOR gates. In order to avoid complicating the illustration of decoder 10, only the set of EOR gates $30_{3,1}$, $30_{3,2}$, and $30_{3,3}$ associated with syndrome correction bit $S_3$ and the set of EOR gates $30_{7,1}$, $30_{7,2}$, and $30_{7,3}$ associated with syndrome correction bit $S_7$ are included in the illustration of FIG. 1. A syndrome correction bit $\hat{S}_i$ equal to one usually indicates that the four syndrome bits from syndrome register 16 which were applied as inputs to its associated AND gate $28_i$ were true indicators of the incorrect state of data bit $X_i$, and consequently are usually false indicators of the correct state of the remaining received data bits related thereto. A number of these data bits are included in later code groups and would, therefore, benefit by removal of the false indicators before they in turn are decoded. Therefore syndrome correction bit $\hat{S}_i$, via EOR gate set $30_i$, is fed back to syndrome register 16 to correct the associated syndrome bits before they are shifted into their subsequent positions in syndrome register 16. The correction process is illustrated in detail in FIG. 1 for syndrome correction bits $\hat{S}_3$ and $\hat{S}_7$. As described hereinbefore, the four syndrome bits which are associated with syndrome correction bit $S_3$ are $S_{47}$, $S_{33}$, $S_{29}$ and $S_0$, as can be seen by reference to syndrome equation $g_3(S)$ in Table I. Thus, in accordance with the present invention, syndrome bits $S_{47}$, $S_{33}$ and $S_{29}$ must be corrected before they are shifted into syndrome bit positions $S_{46}$, $S_{32}$ and $S_{28}$, respectively. Note, syndrome bit $S_0$ need not be corrected since this bit will be removed from syndrome register 16 when the next shift takes place.

To initiate the correction procedure, syndrome bit $S_{47}$ and syndrome correction bit $\hat{S}_3$ are applied as separate inputs to EOR gate $30_{3,1}$, where the output of EOR gate $30_{3,1}$, defined as corrected syndrome bits $S_{3,1}$, is subsequently applied as the input to syndrome bit $S_{46}$ of syndrome register 16. Therefore, in association with the exclusive-OR function, when the $S_3$ input to EOR gate $30_{3,1}$ is equal to the value one, corrected syndrome bit $S_{3,1}$ will be equal to the opposite of syndrome bit $S_{47}$ ($\bar{S}_{47}$), thus correcting the false value from syndrome bit $S_{47}$. In a similar manner, syndrome bit $S_{33}$ and syndrome correction bit $\hat{S}_3$ are applied as separate inputs to EOR gate $30_{3,2}$, where the output corrected syndrome bit $S'_{3,1}$ is subsequently applied as the input to syndrome bit $S_{32}$. Likewise, syndrome bit $S_{29}$ and syndrome correction bit $\hat{S}_3$ are applied as separate inputs to EOR gate $30_{3,3}$ and output corrected syndrome bit $S'_{3,3}$ is applied as the input to syndrome bit $S_{28}$.

The above-described process simultaneously takes place in relation to the remaining syndrome correction bits, where the correspondence between an exemplary syndrome correction bit $\hat{S}_i$ and the actual syndrome bits to be corrected may be determined by reference to the related syndrome equation $g_i(D)$ in Table I and is illustrated for syndrome correction bit $\hat{S}_7$.

In summary, a decoder for convolutional selforthogonal codes has been disclosed, which improves upon the minimal burstiness properties of direct decoding while also retaining the low bit error rate (BER) associated with feedback decoding by maintaining a relatively low threshold level for first threshold logic circuit 24, and a relatively high threshold level for second threshold logic circuit 26. Finally, it is to be understood that the above-described decoder arrangement is exemplary only, since a decoder formed in accordance with the present invention may be arranged to accommodate convolutional self-orthogonal codes which comprise any desired code rate and constraint length.

What is claimed is:

1. A decoder (10) for convolutional self-orthogonal codes comprising
   a multistage syndrome register (16) for storing a plurality of parity bits ($S_{47}$-$S_0$);
   a first majority logic circuit (24) responsive to both a predetermined selection of parity bits from said plurality of parity bits and a plurality of received information bits ($X_1$-$X_7$) for generating a plurality of information correction bits ($C_1$-$C_7$) which correspond in a one-to-one relationship with said plurality of information bits, each information bit comprising a first value (1) when a first threshold level is surpassed and a second value (0) when said first threshold level is not surpassed, said first majority logic circuit producing as an output a plurality of corrected information bits ($\hat{X}_1$-$\hat{X}_7$; and
   a second majority logic circuit (26) responsive to the predetermined selection of parity bits from the multistage syndrome register for generating a plurality of syndrome correction bits ($\hat{S}_1$-$\hat{S}_7$), each syndrome correction bit comprising a first value (1) when a second threshold level is surpassed and a second value (0) when said second threshold level is not surpassed, said second majority logic circuit producing as an output a plurality of corrected syndrome bits (S') which are subsequently applied as inputs to said multistage syndrome register to replace said predetermined selection of syndrome bits.

2. A decoder formed in accordance with claim 1 wherein the first majority logic circuit comprises
   a plurality of majority logic gates ($18_1$-$18_7$), each majority logic gate responsive to a separate subset of the predetermined selection of parity bits for generating a separate one of the plurality of information correction bits ($C_1$-$C_7$), said separate information correction bit comprising a first value (1) when the first threshold level is surpassed and a second value (0) when said first threshold level is not surpassed;
   a plurality of delay elements ($22_1$-$22_7$) each delay element responsive to a separate one of the plurality of information bits for holding said separate ones of the plurality of information bits a number of clock cycles equal to the length of the multistage syndrome register and producing as an output a plurality of delayed information bits; and
   a plurality of exclusive-OR gates ($20_1$-$20_7$), each exclusive-OR gate being responsive to a separate one of said plurality of information correction bits and a separate one of said plurality of delayed information bits for producing as an output of the decoder the plurality of corrected information bits.

3. A decoder formed in accordance with claims 1 or 2 wherein the second majority logic circuit comprises
   a plurality of majority logic gates ($28_1$-$28_7$), each majority logic gate responsive to a separate subset of the predetermined selection of syndrome bits for generating a separate one of the plurality of syndrome correction bits ($S_1$-$S_7$, said separate syndrome correction bit comprising a first value (1) when the second threshold level is surpassed and a second value (0) when said second threshold level is not surpassed; and
   a plurality of sets of exclusive-OR gates ($30_1$-$30_7$), each set of exclusive-OR gates responsive to a separate one of said plurality of syndrome correction bits and said separate subset of said predetermined selection of syndrome bits associated therewith, said plurality of sets of exclusive-OR gates producing as an output the plurality of corrected syndrome bits which are subsequently applied as inputs to the multistage syndrome register to replace said predetermined selection of syndrome bits.

4. A decoder formed in accordance with claims 1 or 2 wherein the first threshold level associated with the first majority logic circuit is less than the second threshold level associated with the second majority logic circuit.

5. A decoder formed in accordance with claim 3 wherein the first threshold level associated with the first majority logic circuit is less than the second threshold level associated with the second majority logic circuit.

* * * * *